United States Patent Office 3,043,725

Patented July 10, 1962

3,043,725

PHOTO TRANSISTOR

Robert E. Anderson, Kingsville, and William A. Little, Richardson, Tex., assignors to Texas Instruments Incorporated, Dallas, Tex., a corporation of Delaware No Drawing. Filed Nov. 6, 1958, Ser. No. 772,162
8 Claims. (Cl. 148—1.5)

This invention relates to a novel photosensitive silicon transistor, and more particularly to an improved method of making a novel photosensitive silicon transistor.

The art of semiconductors and transistors is becoming exceedingly well developed. The art has progressed greatly from its inception when semiconductor devices were produced largely by hand to present day when it is now possible to produce specifically designed devices on a commercially reproducible scale once the techniques for their production have been worked out, usually on a trial and error basis. Unfortunately, technical knowledge is still not developed to the point whereby predictable results can be consistently attained.

One field which has developed out of semiconductor technology is that of fabricating light-sensitive or photosensitive semiconductor devices. It is well recognized that silicon inherently possesses a high degree of sensitivity to both visible and non-visible radiant energy, particularly that in the infrared band.

There are many forms of devices and much has been published regarding the materials useful in making semiconductor devices. Such materials as germanium and silicon, and more recently, semiconductor alloys such as indium-antimonide, gallium-arsenide, and other combinations of elements, particularly those selected from groups 3 and 5 of the periodical table of elements have been used for this purpose. In addition, there has been much development work with respect to active impurities which could be incorporated into a semiconductor material to affect its conductivity type. Essentially, the active impurities fall into two categories. In one type, the impurity atoms contribute electrons when taken up in the crystal structure. These are called donor impurities. In another type, the impurity atoms cause holes in the crystal structure when taken up. These are called acceptor impurities. The addition of impurity materials to semiconductor materials and the principles involved in the incorporation or addition are quite well developed. Further, the techniques by which semiconductor single crystals may be produced and the fabrication of transistors from the semiconductor crystals are also well known in the art.

Despite the extensive development work which has been conducted to date and which is presently continuing at an ever increasing rate, there still remains much to be learned. As mentioned in the foregoing, practically all developments are the result of trial and error, oftentimes involving tedious and costly research. This is particularly true in the area of light sensitive semiconductor materials and devices. It is to this area that the present invention relates. Through research of the type described, a silicon transistor of particular composition has been found which possesses light sensitivity to an exceedingly high degree.

Accordingly, it is an object of the present invention to provide a novel silicon transistor of particular composition which possesses light sensitivity to a high degree.

Other objects and advantages of the present invention will become more readily apparent from the following description of a preferred embodiment of the present invention.

The preferred embodiment of the invention will now be described in detail. The article of the present invention is a silicon transistor bar defining three distinct regions. A collector region and an emitter region are defined at opposite ends of the bar and an intermediate base region is defined therebetween. In the collector region, phosphorus atoms are dispersed throughout the crystal lattice structure of the silicon and constitute the conductivity determining ingredient in this portion of the bar. The collector region is characterized by a resistivity of from one to about four ohm-centimeters and, consequently, contains an amount of phosphorus impurity sufficient to produce this result. In the base region, aluminum and boron atoms are interspersed in the crystal lattice of the silicon in addition to phosphorus atoms. The aluminum and boron atoms predominate, however, and hence they constitute the conductivity determining ingredients. In the emitter region, arsenic atoms are present in addition to all previously named impurities. The combined effect of the phosphorus and arsenic predominates over the effect of the aluminum and boron and, thus, the emitter region is of N-type conductivity.

In order to understand the article of the present invention, reference will now be made to its method of manufacture as regards a specific example. In this way, a better understanding of the proportions of the various ingredients employed and present in the article of the present invention will be obtained.

The article of the present invention is made by a grown diffused technique. This technique involves the growing of a crystal in a conventional crystal growing device or "crystal puller." A charge of 50 grams of silicon is introduced into a quartz-lined graphite crucible and heated by means of RF energy to its melting point in a reducing atmosphere. Thereafter, a seed crystal is introduced into the silicon melt to cause crystallization thereof of a portion of the melt and the seed is thereafter slowly withdrawn. In this way, crystal growth is initiated. The collector region of the crystal is grown first. As noted previously, the original silicon charge contains sufficient phosphorus so that the first grown portion of the crystal will have a resistivity of from one to four ohm-centimeters. After a sufficient portion of the crystal has been grown, approximately ½ milligram of aluminum, 8 milligrams of a boron-silicon alloy containing 0.4% boron, by weight, and 8 milligrams of arsenic are added simultaneously to the melt.

When the aluminum, boron and arsenic are added to the melt, solid state diffusion occurs due to the high temperature of the system in excess of 1400° C. Due to the diffusion coefficients and characteristics of the various materials in the system, aluminum and boron atoms will diffuse ahead of arsenic atoms into the already grown portion of the crystal. This will bring about a conversion of the conductivity type of a narrow layer of the already solidified silicon, changing it from N-type conductivity caused by the presence of phosphorus atoms, to P-type conductivity, caused by the predominance of the aluminum and boron atoms. As the crystal growth is continued to produce the emitter region, the arsenic and phosphorus predominate causing the emitter to be of N-type conductivity. Thus, a very narrow P-type conductivity base region is formed intermediate the N-type conductivity collector region and the N-type conductivity emitter region. A crystal grown in the manner set forth above will have a base resistivity of from 5 to 10 ohm-centimeters near the collector and an emitter resistivity of from 0.02 to 0.05 ohm-centimeter.

Apparently, the enhanced photosensitivity of the transistors made from such a crystal are due to the resistivity gradient on the collector side of the base region which is due to the particular P-type doping impurities used. It is believed that because of the vast difference in the diffusion rates of the P-type impurities (aluminum, very fast; boron, much slower), the emitter side of the base region is of very low resistivity due to the presence of both aluminum and boron in relatively large amounts and collector side of base region is of high resistivity due to the fact that the boron has not diffused entirely across the base region. This resistivity gradient in the base region produces a high accelleration toward the collector of the injected carriers causing more of them to reach the collector or output circuit. Since light striking the base region performs the function of injecting carriers and a greater proportion of the injected carriers reach the collector, the semiconductor devices fabricated from a crystal grown as set out above will exhibit exceptional photosensitive properties.

After the crystal has been fully grown, it may be removed from the crystal pulling apparatus and fabricated in usual fashion. It will be noted that it is conventional to slice and dice crystals which have been grown in this fashion in order to produce bars of any desired size or dimensions. For example, bars may be cut from the crystal having a cross section of approximately 10 x 10 mils and a length of about 100 mils. Each bar may then be finished by etching and mounting on a header.

Transistor bars manufactured in accordance with the present invention were found to have unusual photo sensitivity and, thus, made excellent photo transistors. It is believed that the high degree of photosensitivity possessed by these devices is due to the method used to make the bars and to the specific ingredients and proportions employed in their production.

Although the present invention has been described in terms of a single preferred embodiment, it will be appreciated that changes may be made by those skilled in the art which do not depart from the spirit of the invention. Therefore, the invention is not to be limited by explicitly what is described in the specification, but rather is to include changes and modifications which come within the contemplation and scope of the inventive concepts described and disclosed herein as set forth in the appended claims.

What is claimed is:

1. A grown-diffused junction silicon photo transistor bar comprising a collector portion containing phosphorus and having N-type conductivity, a base portion containing sufficient aluminum and boron to impart P-type conductivity to said base portion and an emitter portion containing sufficient arsenic to impart N-type conductivity to said emitter portion.

2. A grown-diffused junction silicon photo transistor bar in accordance with claim 1, wherein the collector portion has a resistivity of approximately 1–4 ohm-centimeters.

3. A grown-diffused junction silicon photo transistor bar in accordance with claim 1, wherein the base portion contains from $10^{15}$ to $10^{16}$ atoms of aluminum and boron per cubic centimeter of silicon.

4. A method of manufacturing a photosensitive silicon crystal which comprises growing a silicon crystal from a silicon melt containing phosphorus under conditions to produce a first grown collector portion of N-type conductitvity having a resistivity of 1–4 ohm-centimeters, adding amounts of aluminum and boron and arsenic to the melt in such relative percentages that the more rapidly diffusing impurities form a P-type base layer in the already grown portion having a resistivity of 5–10 ohm-centimeters and growing an N-type conductivity emitter portion of the crystal having a resistivity of 0.02–0.05 ohm-centimeter.

5. A method of manufacturing a photosensitive silicon transistor which comprises growing a silicon crystal from a silicon melt containing an N-type conductivity determining impurity to produce an N-type conductivity collector region, adding small amounts of a very fast diffusing P-type conductivity impurity, a P-type conductivity impurity of moderate diffusion rate and a very slow diffusing N-type conductivity impurity to the melt, increasing the temperature of the melt to cause said P-type conductivity impurities to diffuse into the already formed collector region to provide a P-type conductivity base region having a resistivity gradient resulting from the vast difference in diffusion rates of said P-type impurities, and growing a further crystal portion of N-type conductivity to provide an emitter region in said transistor.

6. A method of manufacturing a transistor crystal which comprises growing a semiconductor crystal from a melt of semiconductor material containing an impurity of one conductivity type to produce a first grown crystal portion of one-type conductivity, adding small amounts of a very fast diffusing impurity of opposite type conductivity, an impurity of the opposite type conductivity having a moderate diffusion rate and a slow diffusing impurity of the one-type conductivity to the melt, increasing the temperature of the melt to cause said opposite type conductivity impurities to diffuse into the already grown portion to provide a thin layer of opposite conductivity having a resistivity gradient resulting from the vast difference in diffusion rates of said impurities of opposite conductivity type, and growing a further crystal portion characterized by one-type conductivity due to the predominance of said third impurity in the melt.

7. A method of manufacturing a photosensitive silicon transistor which comprises growing a silicon crystal from a silicon melt containing phosphorus to produce a first grown crystal portion of N-type conductivity, simultaneously adding a mixture of aluminum, boron and arsenic to said melt, producing a P-type layer having a resistivity gradient by diffusing the aluminum and boron into the first grown portion of N-type conductivity, and growing a further crystal portion of N-type conductivity.

8. The method according to claim 7 wherein said mixture comprises about one-half mg. aluminum, about 8 mg. of an alloy comprising about 99.6% silicon and 0.4% boron by weight and about 8 mg. of arsenic per 50 grams of silicon in the original melt.

References Cited in the file of this patent

UNITED STATES PATENTS

| | | |
|---|---|---|
| 2,567,970 | Scaff et al. | Sept. 18, 1951 |
| 2,727,839 | Sparks | Dec. 20, 1955 |
| 2,739,088 | Pfann | Mar. 20, 1956 |